US006874395B2

United States Patent
Ishii et al.

(10) Patent No.: US 6,874,395 B2
(45) Date of Patent: Apr. 5, 2005

(54) PUNCHING DEVICE AND WORKPIECE PROCESSING METHOD

(75) Inventors: Toru Ishii, Hamamatsu (JP); Hiromichi Matsui, Hamamatsu (JP); Yasuaki Mizuno, Hamamatsu (JP); Makoto Teraoka, Hamamatsu (JP)

(73) Assignee: Yamaha Fine Technologies Co., Ltd.

( * ) Notice: Subject to any disclaimer, the term of this patent is extended or adjusted under 35 U.S.C. 154(b) by 234 days.

(21) Appl. No.: 10/079,400

(22) Filed: Feb. 22, 2002

(65) Prior Publication Data

US 2002/0124699 A1 Sep. 12, 2002

(30) Foreign Application Priority Data

Mar. 7, 2001 (JP) ..................... P2001-063409

(51) Int. Cl.[7] .............. B26D 3/00; B23Q 15/00
(52) U.S. Cl. .......... 83/13; 83/55; 83/75; 83/76.8; 83/365; 83/367; 83/364; 700/192
(58) Field of Search .............. 83/35, 74, 75, 83/75.5, 76.7, 76.8, 364, 365, 367, 520, 521, 55, 13, 684; 700/160, 192, 206; 382/141, 287; 716/21

(56) References Cited

U.S. PATENT DOCUMENTS 4,481,533 A * 11/1984 Alzmann et al. ............. 348/95
4,596,037 A * 6/1986 Bouchard et al. .......... 382/141
4,628,578 A * 12/1986 Yajima .................. 29/407.01
4,829,375 A * 5/1989 Alzmann et al. ............. 348/87
4,849,914 A * 7/1989 Medioni et al. ............ 382/112
6,467,383 B1 * 10/2002 Charbonnier .............. 83/76.6
6,470,796 B2 * 10/2002 Hayashi ...................... 100/43
2002/0029672 A1 * 3/2002 Raney et al. ............... 83/76.8

FOREIGN PATENT DOCUMENTS

JP            10-118995           5/1998

* cited by examiner

Primary Examiner—Boyer D. Ashley
(74) Attorney, Agent, or Firm—Dickstein, Shapiro, Morin & Oshinsky, LLP.

(57) ABSTRACT

A punching device of the present invention is proposed which can perform positional alignment with high accuracy without generating positional deviation or vibration by shifting a workpiece, and which does not deteriorate the accuracy of determining the position of an image by shifting a photographic device. In this punching device, a CCD camera, which can photograph the position of the die hole upon the lower die and the position of the pattern upon the workpiece which shows the position thereon where punching is to be performed, is fixedly provided at a position removed from the raising and lowering track of the punch plate. Furthermore, a mirror may be provided between the CCD camera and the die hole upon the lower die.

14 Claims, 7 Drawing Sheets

PUNCHING DEVICE AND WORKPIECE PROCESSING METHOD

BACKGROUND OF THE INVENTION

1. Field of the Invention

The present invention relates to a punching device which punches a hole of a specified shape in a plate shaped workpiece, and to a workpiece processing method which utilizes this punching device.

2. Description of the Prior Art

When punching a hole of a specified shape in a plate shaped workpiece, a punching device has been employed which comprises a die in the upper surface of which a die hole is formed, and a punch which can be raised and lowered with respect to this die so as to enter into the die hole of the die. And a pattern which shows the positions to be punched is provided upon a workpiece which can be processed by being punched using this type of punching device, so that the punching process can be performed with high accuracy when this pattern is accurately aligned with the die hole. In order to do this, a punching device has been developed in which a photographic device is provided for detecting the position of the workpiece. In this punching device, position determination for the punching process is performed by shifting the workpiece to a position in which it can be photographed by the photographic device, and when performing punching, the workpiece is further shifted to the correct position for being punched.

Furthermore, a punching device in which the position of the workpiece is detected by photography without shifting the workpiece has been developed, and has been disclosed in Japanese Patent Application, First Publication No. Hei 10-118995. This punching device performs position determination of the workpiece by shifting the photographic device to an axis which joins the die hole of the die and the punch, and when punching is to be performed, the photographic device is removed away from the above described axis, so that the punching process can be performed.

However, with the former prior art punching device, when shifting the workpiece from the photographic position to the punching position, there is the problem that the accuracy deteriorates due to occurrence of positional deviation between the workpiece and the die, and also that the accuracy becomes further deteriorated due to the length of the distance through which shifting is performed. In addition, the problem also arises that the work efficiency is poor, because, after the shifting has stopped, it is necessary to wait until vibration set up by the shifting has died away.

Furthermore, with the latter prior art punching device, the problem arises that detection of the position of the workpiece at high accuracy cannot be anticipated, since the photographic device is frequently shifted, and accordingly the position of the photographic device when detecting the position of the workpiece is not necessarily always the same.

SUMMARY OF THE INVENTION

The present invention has been made in consideration of the above described problems with the prior art, and its objective is to provide a punching device, and a workpiece processing method which utilizes said punching device, which can perform position determination at high accuracy, without generating positional deviation or vibration by shifting the workpiece, and without deteriorating the accuracy of detection of the position of the workpiece by shifting the photographic device.

In order to attain the above described objective, the present invention proposes, according to its device aspect, a punching device, comprising: a main stand, to which is fixed a die which is provided with a die hole in its upper surface; a table, which is provided so as to be shiftable with respect to the main stand, which is formed with a hole approximately in its central portion for exposing the die, and which further is made so that a workpiece can be mounted upon its upper surface; a shift mechanism which shifts the table with respect to the main stand; a raising and lowering mechanism which is arranged above the table and raises and lowers a punch plate to which is fitted a punch which can be engaged into the die hole; a first photographic device, which is fixed in a position removed from the raising and lowering track of the punch plate, and which photographs a first image which shows the position of the die hole in the die, and a second image which shows the position of a pattern which indicates the position upon the workpiece which is to be punched; and a shifting control means which controls the shift mechanism according to the first and second images which are photographed by the first photographic device, so as, by shifting the table, to align the position of the pattern which indicates the position upon the workpiece which is to be punched to the position of the die hole in the die.

It should be understood that, in the above specified structure, by a portion being removed from the raising and lowering track of the punch plate, is meant that this portion is removed from the axis which joins the die hole and the punch, so that it is acceptable for the first photographic device to be set up in any position in which it does not obstruct the raising and lowering of the punch plate to which the punch is fitted. For example, it is acceptable for the first photographic device to be fixed at the side of the axis which joins the die hole and the punch, and to photograph the workpiece upon the table and the die hole from above at a slanting angle.

In this case, it is desirable for the shift mechanism to shift the table with respect to the main stand in two mutually perpendicular directions in a horizontal plane. Furthermore, in this case, it is further desirable for the shift mechanism to further rotate the table with respect to the main stand within the horizontal plane around a vertical axis.

According to the characteristics of the present invention as specified above, since the first photographic device which detects the position of the die hole in the die and the position of the pattern which indicates the position upon the workpiece which is to be punched is provided in a position removed from the raising and lowering track of the punch plate, thereby images can be photographed which show the position of the die hole in the die and the position of the pattern which indicates the position upon the workpiece which is to be punched, with the first photographic device fixed just as it is, and moreover without shifting the workpiece. And the shifting control means controls the shift mechanism according to the images which are photographed by the first photographic device, so as, by shifting the table, to align the position of the pattern which indicates the position upon the workpiece which is to be punched to the position of the die hole in the die. As a result, according to the present invention, it becomes possible to perform positional alignment of the workpiece with high accuracy without generating positional deviation or vibration by shifting the workpiece or the first photographic device.

Furthermore, according to a more particular aspect of the present invention, it is desirable for this punching device further to include a second photographic device which is fixed in a position removed from the raising and lowering track of the punch plate, and which photographs an image which shows the position of the die hole in the die, and the position of the pattern which shows the position upon the workpiece which is to be punched; and a monitor device which displays the image which is photographed by the second photographic device.

In this case, by the operator fixing the workpiece in a suitable position upon the table while observing the monitor device, the shifting control means, in cooperation with the first photographic device, is enabled to perform alignment of the position of the pattern which shows the position upon the workpiece which is to be punched to the position of the die hole in the die by shifting the table.

Moreover, in this case, it is not necessary to utilize a photographic device of high accuracy for the second photographic device, since there is no requirement for the operator to position the workpiece with high accuracy when fixing it upon the table. Furthermore, since the alignment of the position of the pattern which shows the position upon the workpiece which is to be punched to the position of the die hole in the die is completed for the time being by this operation, albeit not at high accuracy, thereby it is not necessary for the first photographic device to reproduce an image of such a wide region, and it is possible to reduce the range over which the shift mechanism is required to perform shifting of the workpiece. As a result, according to the present invention, along with it becoming possible to manufacture this punching device at low cost, it is possible further to enhance the positional accuracy for fixing the workpiece.

Furthermore, according to another more particular aspect of the present invention, it is desirable, in the above described punching device, to interpose a mirror in the optical path between the first photographic device and the table, and for the first photographic device to photograph the first image which shows the position of the die hole in the die, and the second image which shows the position of the pattern which shows the position upon the workpiece which is to be punched, via the mirror. By this structure the degree of freedom for the position for the photographic device is increased, and accordingly the freedom for designing the structure of the punching device itself is increased.

Furthermore, in order to attain the above described objective, the present invention proposes, according to its method aspect, a workpiece processing method in which a workpiece is subjected to a punching process using a punching device which comprises: a main stand to which is fixed a die which is provided with a die hole in its upper surface; a table which is provided so as to be shiftable with respect to the main stand, which is formed with a hole approximately in its central portion for exposing the die, and which further is made so that a workpiece can be mounted upon its upper surface; and a raising and lowering mechanism which raises and lowers a punch plate to which is fitted a punch which can be engaged into the die hole, which is arranged above the table; comprising: an insertion and fixing step of inserting the workpiece between the table and the punch plate and fixing it to the table, with the die being fixed to the main stand and being exposed through the hole in the table; a step of photographing a first image which shows the position of the die hole in the die with a first photographic device which is fixed in a position removed from the raising and lowering track of the punch plate; a step of, after fixing the workpiece, photographing with the first photographic device a second image which shows the position of a pattern which indicates the position upon the workpiece which is to be punched; an alignment step of shifting the table according to the first and second images so as to align the position of the pattern which indicates the position upon the workpiece which is to be punched to the position of the die hole in the die; and a punching step of, after the alignment step, lowering the punch plate which is fitted to the punch and punching the workpiece.

With this workpiece processing method, the first photographic device is kept fixed just as it is in its position as removed from the raising and lowering track of the punch plate during the sequence of processes comprising the insertion and fixing step, the alignment step, and the punching step. Furthermore, the workpiece is also not shifted after the alignment step. As a result, according to the present invention, it is possible to perform positional alignment of the workpiece with high accuracy without generating positional deviation or vibration by shifting the workpiece or the first photographic device, and the workpiece can be punched with high accuracy.

Furthermore, according to a more particular aspect of the present invention, it is desirable, in the above workpiece processing method, for the insertion and fixing step to include: an insertion step of, while photographing an image which shows the position of the die hole in the die and the position of the pattern which shows the position upon the workpiece which is to be punched with a second photographic device which is fixed in a position removed from the raising and lowering track of the punch plate, inserting the workpiece and positioning it upon the table according to the photographic image; and a fixing step of, after inserting the workpiece, fixing the inserted workpiece to the table.

In this case, it is not necessary to utilize a photographic device of high accuracy for the second photographic device, since there is no requirement for inserting the workpiece with high accuracy when fixing it upon the table in an appropriate position. Furthermore, since the alignment of the position of the pattern which indicates the position upon the workpiece which is to be punched to the position of the die hole in the die is completed for the time being by this insertion and fixing operation, albeit not at high accuracy, thereby it is not necessary for the first photographic device to reproduce an image of such a wide region, and it is possible to align the position of the pattern which indicates the position upon the workpiece which is to be punched to the position of the die hole in the die with high accuracy. Furthermore, in the alignment step, it is possible to manage with a reduced range over which the shift mechanism is required to perform shifting of the workpiece, and it becomes possible to perform alignment of the workpiece with high accuracy and moreover in a short time period, without any requirement for using a large scale photographic device as the first photographic device.

DESCRIPTION OF THE PREFERRED EMBODIMENTS

Figure 1:
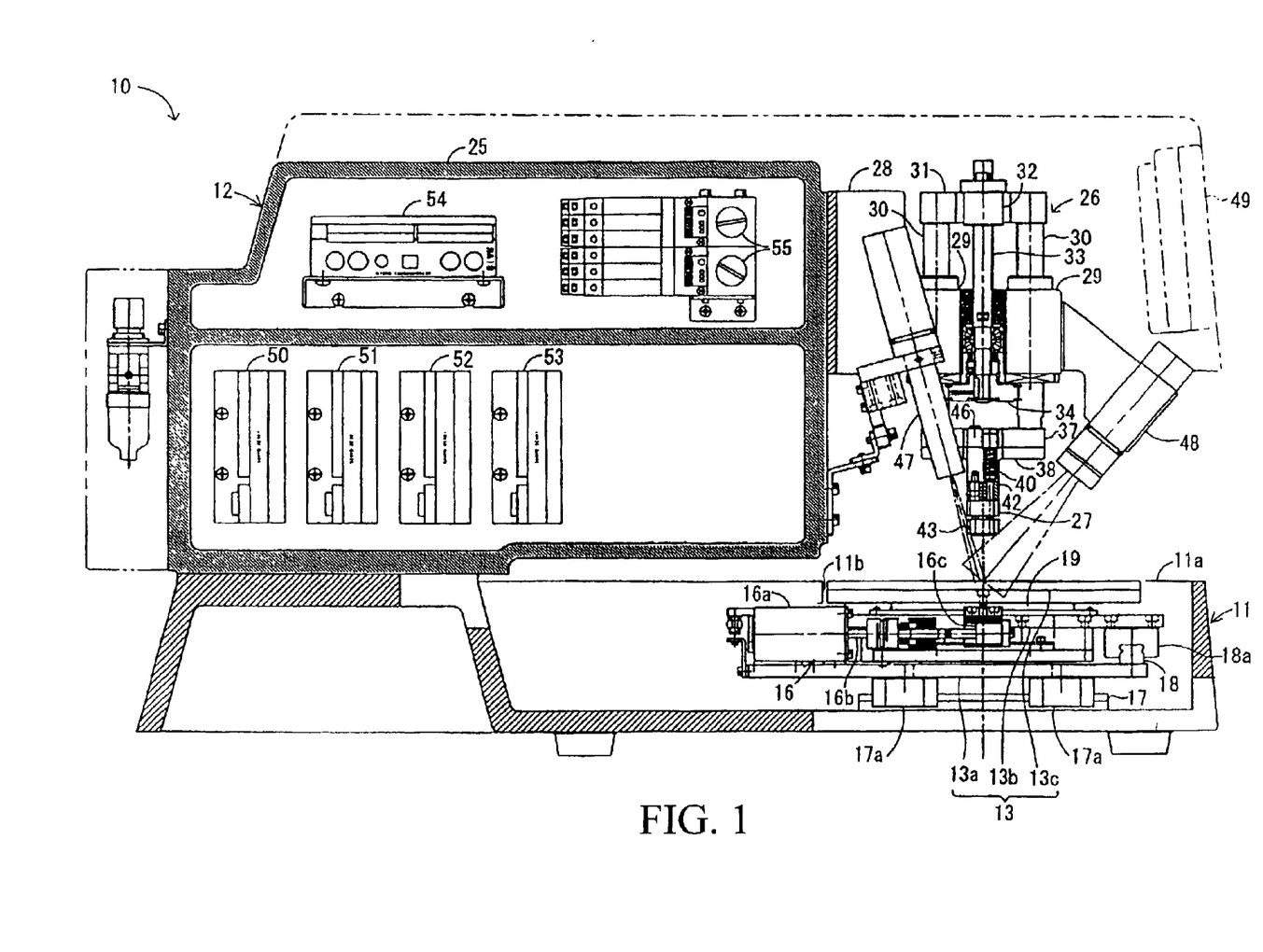
FIG. 1 is a schematic side view showing a preferred embodiment of the punching device according to the present invention.
Figure 2:
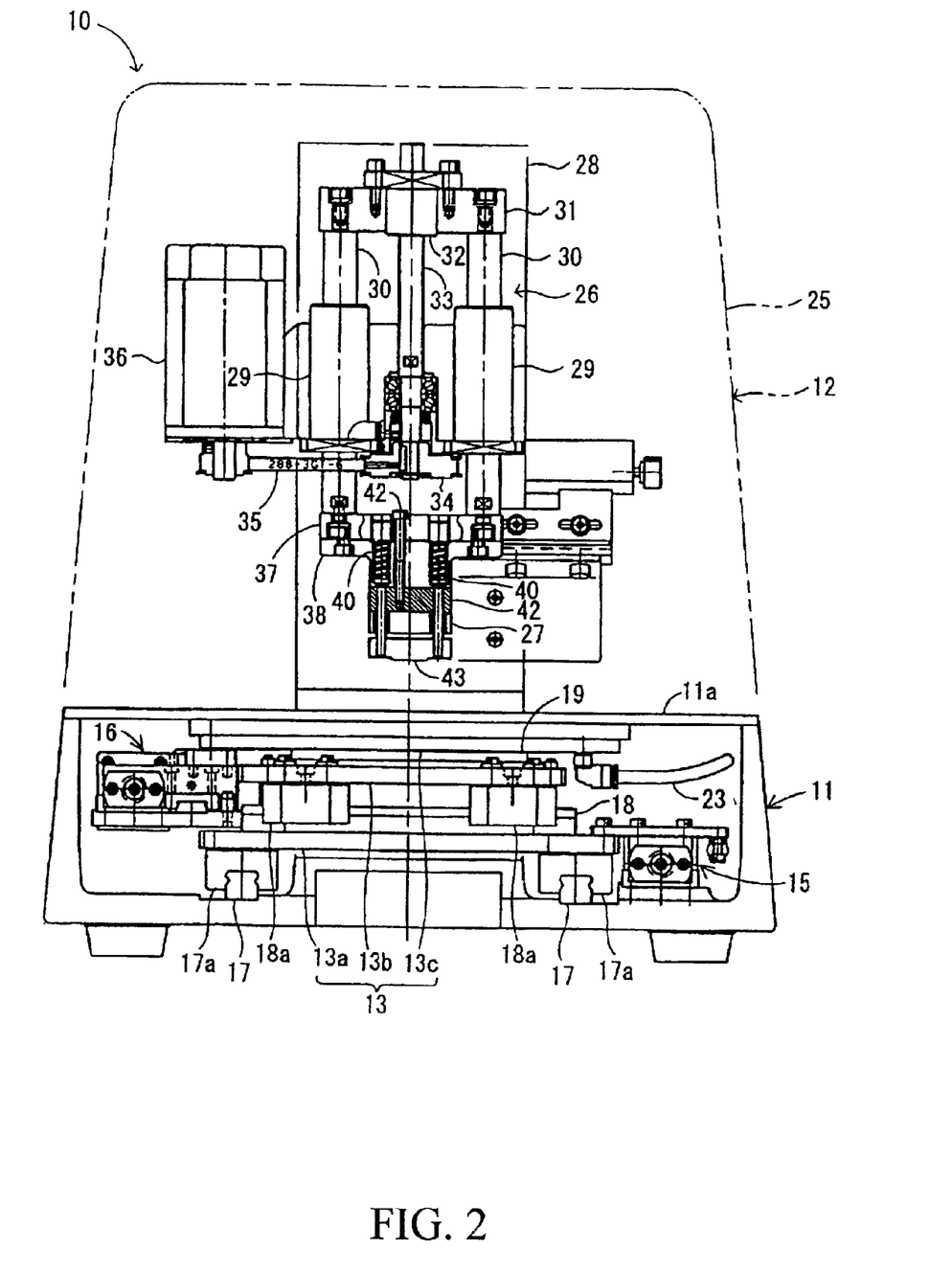
FIG. 2 is a front view showing the punching device of FIG. 1 in its state with a monitor device section removed.
Figure 3:
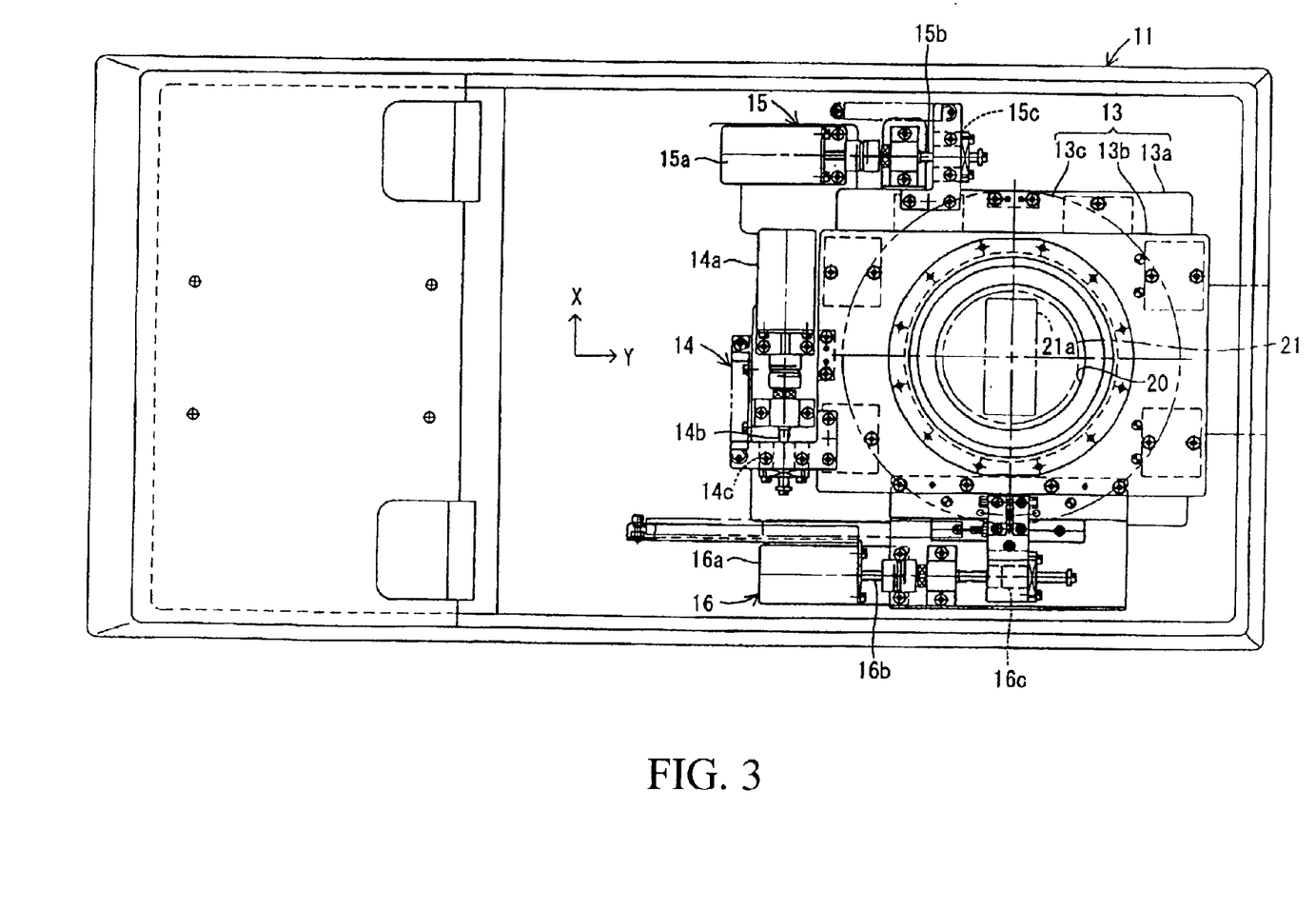
FIG. 3 is a plan view showing a main stand of the punching device of FIG. 1.

The following are preferred embodiments of the present invention will be described with reference to the figures. FIG. 1 is a schematic side view showing of the punching device according to the first preferred embodiment; FIG. 2 is a front view showing this punching device in its state with a monitor device section removed; and FIG. 3 is a plan view showing a main stand of the punching device. This punching device 10 comprises a roughly rectangular shaped main stand 11 which is provided upon a work floor (not shown in the figures), and a main body portion 12 which is provided upon an upper portion of the main stand 11.

A table 13 is fitted onto the main stand 11 so as to be shiftable in the horizontal plane. This table 13 can be shifted by an X-axis shift mechanism 14, a Y-axis shift mechanism 15, and a θ-axis shift mechanism 16, respectively, in an X-axis direction in the horizontal plane (the left and right direction with respect to the drawing paper in FIG. 3), a Y-axis direction which is perpendicular to this X-axis direction in the horizontal plane (the upward and downward direction with respect to the drawing paper in FIG. 3), and a θ-axis rotational direction around a vertical axis perpendicular to the X-axis and the Y-axis (the rotational direction around a vertical axis perpendicular to the drawing paper in FIG. 3).

The table 13 comprises a Y-axis shift section 13a which is supported upon the main stand 11 by fixing the side portion thereof and can be shifted along the Y-axis direction, an X-axis shift section 13b which is supported upon this Y-axis shift section 13a and can be shifted along the X-axis direction, and a θ-axis shift section 13c which is supported on this X-axis shift section 13b and can be rotated around the θ-axis direction. In more detail, the Y-axis shift section 13a is fixed upon four sliding support portions 17a which can be shifted along two guide rails 17 which are provided upon the internal bottom surface of the main stand 11 and which extend along the Y-axis direction, and the X-axis shift section 13b is fixed upon four sliding support portions 18a which can be shifted along two guide rails 18 which are provided upon the upper surface of the Y-axis shift section 13a and which extend along the X-axis direction. And the θ-axis shift section 13c is mounted upon the X-axis shift section 13b so as to be freely rotatable around a shaft portion 19 which is provided upon the upper surface of the X-axis shift section 13b.

Accordingly, when the Y-axis shift section 13a is shifted along the Y-axis direction, the X-axis shift section 13b and the θ-axis shift section 13c are also shifted together therewith in the Y-axis direction, and similarly, when the X-axis shift section 13b is shifted along the X-axis direction, the θ-axis shift section 13c is also shifted together therewith in the X-axis direction. However, when the θ-axis shift section 13c is rotated around the θ-axis direction, only this θ-axis shift section 13c is rotated around the θ-axis direction by itself.

Furthermore, the Y-axis shift mechanism 15 comprises a motor 15a which is mounted upon the internal bottom surface of the main stand 11 and which comprises a shaft portion 15b formed with a screw, and a nut 15c which is engaged with this screw and is coupled to the Y-axis shift section 13a, so that, when the motor 15a is driven, the nut 15c, the Y-axis shift section 13a, the X-axis shift section 13b and the θ-axis shift section 13c are shifted together along the Y-axis direction. Further, the X-axis shift mechanism 14 comprises a motor 14a which is mounted upon the Y-axis shift section 13a and which comprises a shaft portion 14b formed with a screw, and a nut 14c which is engaged with this screw and is coupled to the X-axis shift section 13b so that, when the motor 14a is driven, the nut 14c, the X-axis shift section 13b and the θ-axis shift section 13c are shifted together along the X-axis direction. Moreover, the θ-axis shift mechanism 16 comprises a motor 16a which is mounted upon the X-axis shift section 13b and which comprises a shaft portion 16b formed with a screw, and a nut 16c which is engaged with this screw and is coupled to the θ-axis shift section 13c via an engagement structure so that, when the motor 16a is driven, the nut 16c is shifted along the Y-axis direction, and thereby the θ-axis shift section 13c is rotated around the θ-axis direction. The above-mentioned engagement structure comprises a pin which is provided to the nut 16c so as to project outwards therefrom, and a groove which is provided upon an edge portion of the θ-axis shift section 13c, and the width and the length of this groove are made great enough to accommodate this pin so that the pin can be moved therein, and moreover so that they cannot become disengaged due to the rotation of the θ-axis shift section 13c.

Yet further, a hole 20 as shown in FIG. 3 is provided roughly in the central portion of the table 13, and a die 21, to which a rectangular shaped molding die 21a is fitted, is fitted within the central portion thereof so as to be visible through the hole 20. This die 21 is fixed upon a die base 22 (refer to FIG. 4) so as to be separated from the periphery of the hole 20 by a small gap, and this die base 22 is fixed upon the bottom surface of the main stand 11. Furthermore, a "C" shaped die hole 21b and two holes 21c for positional adjustment are pierced in the upper surface of the molding die 21a, as shown in FIG. 5. And small holes for sucking air (not shown in the figure) are pierced in predetermined positions in the θ-axis shift section 13c, so that, by the operation of a connected suction device (not shown in the figures) via a hose 23, a workpiece 24 which is loaded upon the upper surface of the θ-axis shift section 13c (refer to FIG. 6) can be fixed down thereto by suction. It should be understood that a gap 11b of width equal to the width of the gap between the die 21 and the edge portion of the hole 20 is provided between the outer peripheral portion of the θ-axis shift section 13c and an upper surface portion 11a of the main stand 11, so that the θ-axis shift section 13c is permitted to move in the horizontal direction by just the length of this gap 11b.

Furthermore, the main body portion 12 comprises a box shaped housing section 25 which houses various types of control element and a CPU, and a raising and lowering mechanism 26. This raising and lowering mechanism 26 is for raising and lowering a punch plate 27 (refer to FIG. 7) which comprises a punch 27a which pierces a "C" shaped hole in the workpiece 24 by engaging with the die hole 21b of the die 21, and it is held in a position above the die 21 by a base frame 28 which is fixed upon the side surface of the housing section 25. Four support cylinders 29 are fixed to this base frame 28, and four guide shafts 30 are freely slidably inserted inside these support tubes 29. And a ball nut 32 is fixed in the center of a bridge plate 31 which is fixed upon the upper ends of these guide shafts 30.

A ball screw 33 is threaded into this ball nut 32, and the lower end of this ball screw 33 being linked to a pulley 34 which is fixed to the base frame 28. Furthermore, this pulley 34 is driven by a motor 36 via an endless belt 35. Accordingly, when the motor 36 is driven, the pulley 34 is rotated and thereby the ball screw is rotated, so that the ball nut 32 is lowered or raised, and thereby the bridge plate 31 together with the guide shafts 30 are lowered or raised. It should be noted that the motor 36, as well, is fixed to the base frame 28.

Figure 4:
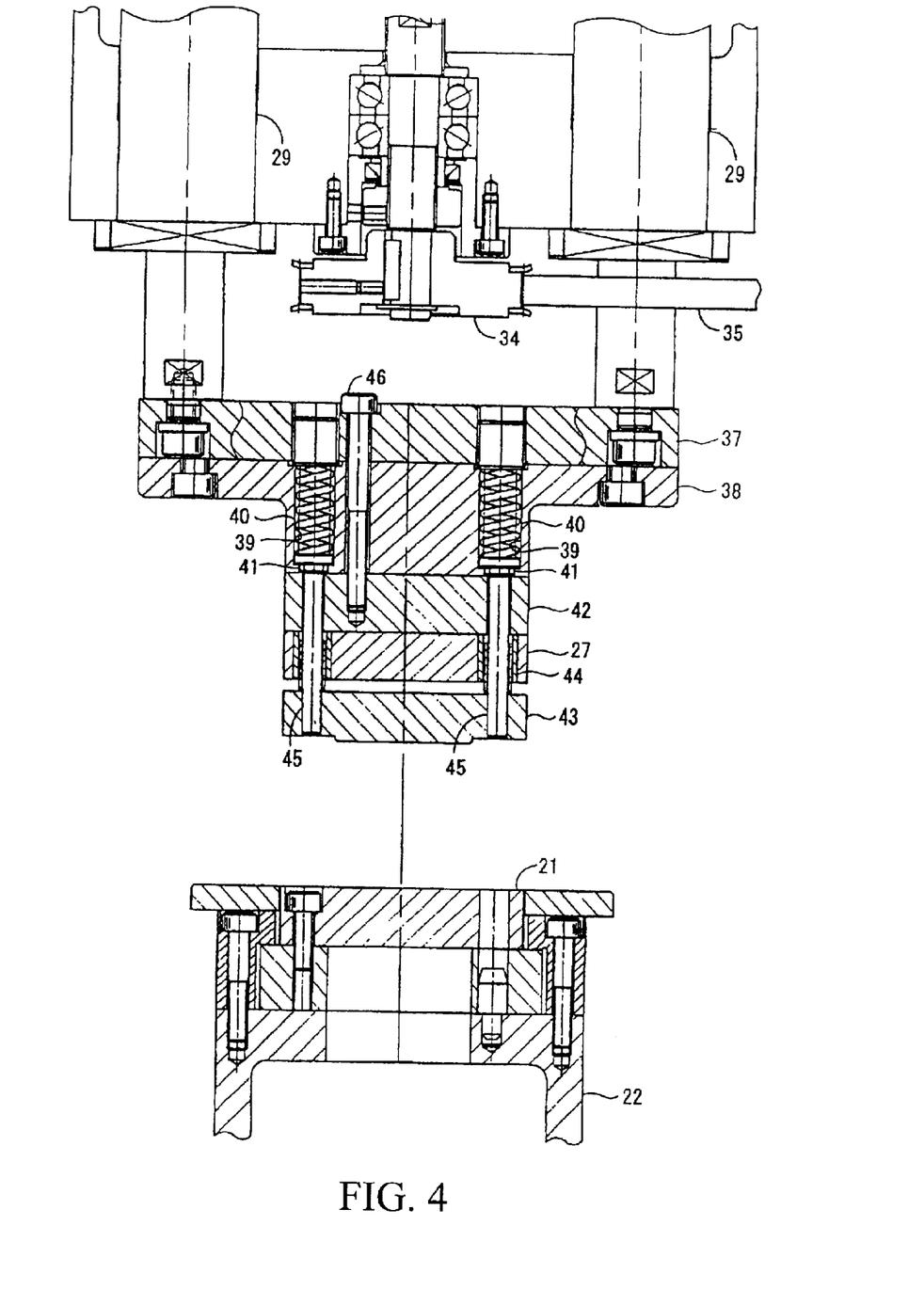
FIG. 4 is an enlarged front view showing essential portions of a raising and lowering mechanism of the punching device of FIG. 1.
Figure 5:
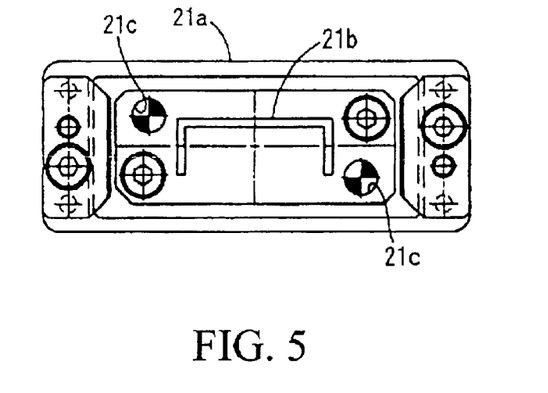
FIG. 5 is a plan view of an example of a molding die.
Figure 7:
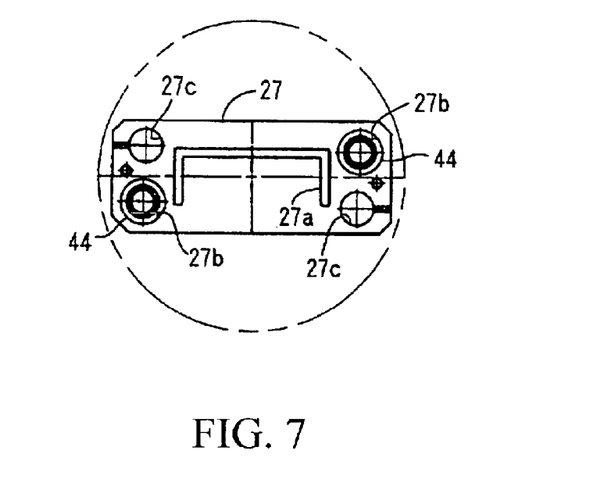
FIG. 7 is a plan view of an example of a punch plate.
Figure 8:
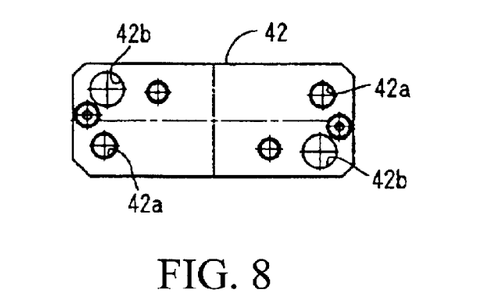
FIG. 8 is a plan view of an example of a backing plate.

As shown in FIG. 4, a guide plate 37 is fitted to the lower ends of the guide shafts 30, and a punch fitting plate 38 is fitted to the lower surface of this guide plate 37. Two spring housing holes 39 are provided in the interior of this punch fitting plate 38 with a certain space therebetween, and two coil springs 40 are housed in these spring housing holes 39. The upper ends of these coil springs 40 press against the lower surface of the guide plate 37, while their lower ends are engaged against C-rings (circlips) 41. A backing plate 42 is provided against the lower surface of the punch fitting plate 38, with the punch plate 27 being provided against the lower surface of this backing plate 42. Furthermore, a stripper 43 is provided below the punch plate 27 with a small space being maintained therebetween. The upper surface of this backing plate 42 is shown in FIG. 8, and through it there are pierced two pin insertion holes 42a and two position determination holes 42b. Moreover, the upper surface of the punch plate 27 is shown in FIG. 7, and through it there are pierced two pin insertion holes 27b whose diameters are somewhat greater than those of the pin insertion holes 42a of the backing plate 42, and two position determination holes 27c of the same diameters and in the same positions as the position determination holes 42b in the backing plate 42.

Figure 9:
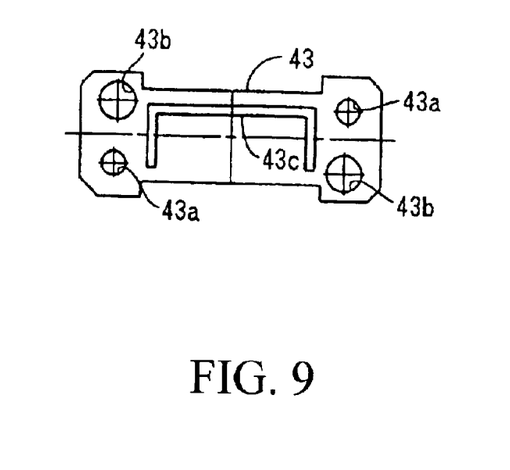
FIG. 9 is a plan view of an example of a stripper.

A circular cylindrical miniature guides 44 are fitted inside the pin insertion holes 27b. Furthermore, the punch 27a which is "C" shaped in cross section is embedded in the central portion of the punch plate 27, and the lower end of this punch 27a projects from the punch plate 27 and extends as far as the lower end of the stripper 43. The upper surface of the stripper 43 is shown in FIG. 9, and through it there are pierced two pin fixing holes 43a and two position determination holes 43b. And through its central portion, there is pierced a punch insertion hole 43c which is "C" shaped in cross section, through which the punch 27a can pass.

Furthermore, pins 45 are inserted through the pin insertion holes 42a of the backing plate 42 and through the miniature guides 44 of the punch plate 27, and the lower ends of these pins 45 are fixed into the pin fixing holes 43a of the stripper 43. These pins 45 extend in the vertical direction, with their upper ends being fixed to the coil springs 40 by the aforementioned C-rings (circlips) 41. Furthermore, the guide plate 37, the punch fitting plate 38, and the backing plate 42 are fixed together by fixing bolts 46, only one of which is shown in the drawing. Accordingly, the coil springs 40 cannot extend themselves, and can be compressed only by the width of the space between the punch plate 27 and the stripper 43. It should be noted that the backing plate 42 and the punch plate 27 are also fixed together by bolts which are not shown in the drawing.

A CCD camera 47 which serves as a first photographic device is fixed to the side surface of the housing section 25 of the main body portion 12, confronting the die hole 21b of the die 21. This CCD camera 47 functions as a photographic device which photographs the position of the die hole 21b and the position of a pattern 24a on the workpiece 24 which is fixed over the die 21, and is fitted in a tilted orientation so as to be able to photograph the die hole 21b from its upper side at an angle, while avoiding the raising and lowering track of the punch plate 27 etc. so as not to obstruct its raising and lowering.

Furthermore, a monitor camera 48 which serves as a second photographic device is provided, fixed to the tip end portion of the base frame 28 which supports the raising and lowering mechanism 26, and confronting the die hole 21b of the die 21, and an image of the die hole 21b and of the pattern 24a upon the workpiece 24 which is taken by this monitor camera 48 can be projected upon a monitor device 49 which is provided upon the front side of the raising and lowering mechanism 26. This monitor camera 48 is also disposed in a tilted orientation so as to avoid the raising and lowering track of the punch plate 27 etc., just like the CCD camera 47.

An X-axis control section 50 which controls the shifting of the X-axis shift section 13b in the X-axis direction, a Y-axis control section 51 which controls the shifting of the Y-axis shift section 13b in the Y-axis direction, a θ-axis control section 52 which controls the rotation of the θ-axis shift section 13c around the θ-axis, and a punch control section 53 which controls the raising and lowering of the punch 27a are housed in the lower portion of the housing section 25.

Furthermore, a CPU 54 for image processing and position control, and valves 55 for controlling the above-mentioned suction device, are provided in the upper portion of the housing section 25. The CPU 54 functions to input the image which is taken by the CCD camera 47, to perform image processing thereupon so as to convert it into positional data, and to output the difference between two sets of positional data (as will be described hereinafter) as correction data to the X-axis control section 50, the Y-axis control section 51, and the θ-axis control section 52.

Figure 6:
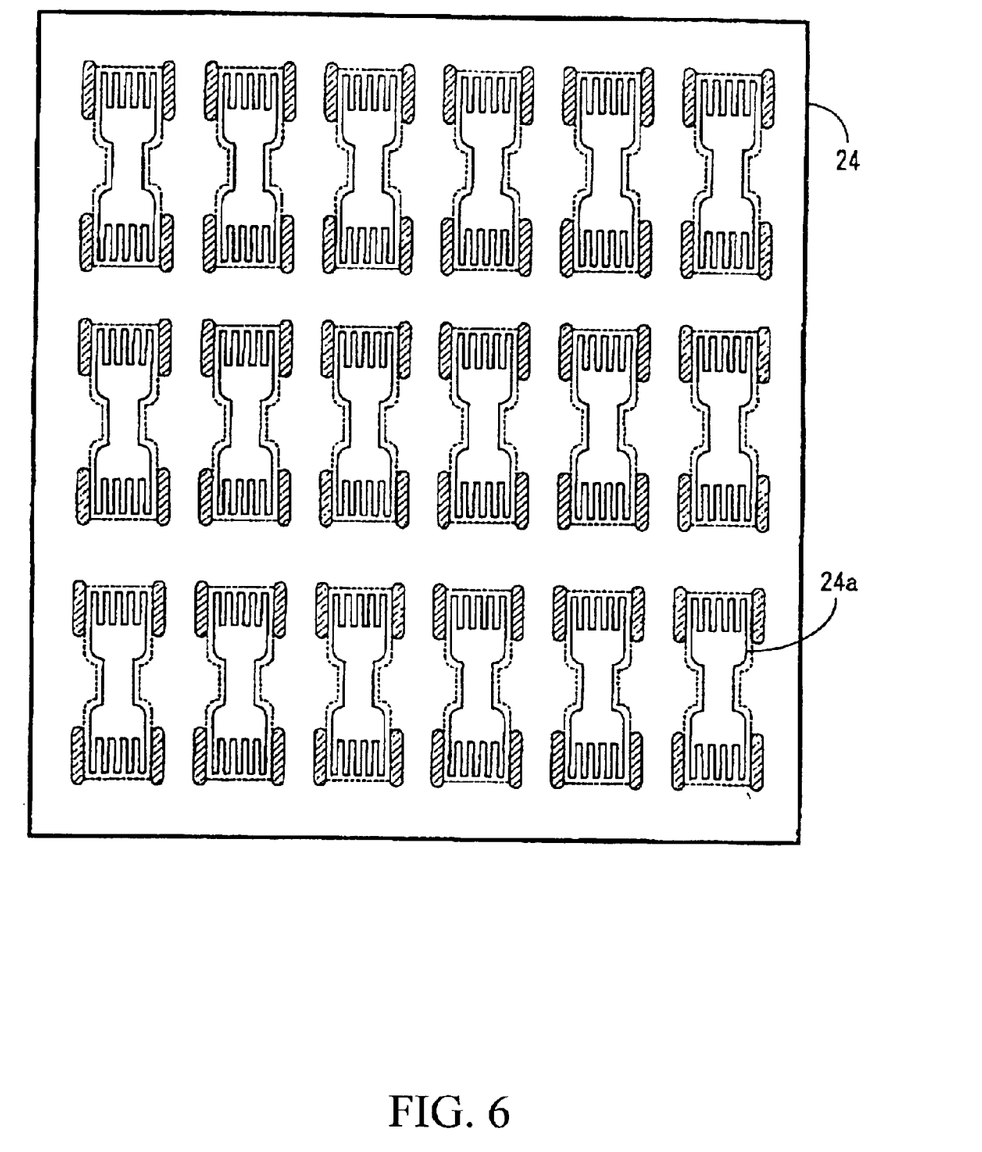
FIG. 6 is a plan view showing an example of patterns on a workpiece.

With this type of structure, when performing a punching process upon the workpiece 24 following a pattern 24a upon the workpiece 24 like that shown in FIG. 6, first, in the state of the apparatus with the punch 27a and so on raised up by the raising and lowering mechanism 26, the die hole 21b of the die 21 is photographed by the CCD camera 47. By doing this, the image data produced thereby is transmitted to the CPU 54 and is image processed into positional data which is stored in the storage section (not shown in the figures). Next, the operator loads the workpiece 24 upon the θ-axis shift section 13c while viewing the image photographed by the monitor camera 48 upon the monitor device 49, so that the pattern 24a upon the workpiece 24 is roughly in alignment with the die hole 21b. Next, the suction device is operated by actuating the valves 55 upon the housing section 25, and thereby the workpiece 24 is fixed upon the θ-axis shift section 13c.

And the pattern 24a on the workpiece 24 is photographed by the CCD camera 47. The image data resulting therefrom are transmitted to the CPU 54 and are image processed into positional data, which is then stored in the storage section. The difference between the positional data for this pattern 24a and the previously obtained positional data for the die hole 21b is subjected by the CPU 54 to calculation processing as a deviation, so as to yield correction data. And, based upon this correction data, the CPU 54 outputs correction commands to the X-axis control section 50, the Y-axis control section 51, and the θ-axis control section 52.

These control sections 50, 51, 52 which have received these correction commands shift the workpiece 24 to an appropriate position by shifting the table 13 by driving the appropriate motors. In other words, the X-axis control section 50 drives the motor 14a and shifts the X-axis shift section 13b along the X-axis to an appropriate position, and the Y-axis control section 51 drives the motor 15a and shifts the Y-axis shift section 13a along the Y-axis to an appropriate position. Furthermore, the θ-axis control section 52 drives the motor 16a and rotates the θ-axis shift section 13c around the θ-axis to an appropriate position, while not disturbing its position along the X-axis and along the Y-axis. As a result, the pattern 24a upon the workpiece 24 comes to be accurately aligned with the die hole 21b. And then the punch 27a is lowered, and a "C" shaped hole is pierced through the workpiece 24 in the appropriate location thereupon.

In the operation at this time, first, the portion of the raising and lowering mechanism 26 which performs raising and lowering is lowered, and the stripper 43 comes into contact with the die 21. Thereafter the lowering is further continued, and, since the pins 45 slide freely through the punch plate 27 and the backing plate 42, the stripper 43 and the pin 45 compress the coil springs 40, and are raised up relative to the punch plate 27 etc. As a result the punch 27a projects from the bottom surface of the stripper 43 and engages with the die hole 21b, thus piercing the workpiece 24.

By repeating the above described operations, it is possible to pierce the workpiece 24 along all the patterns 24a thereupon. In this manner it becomes unnecessary to shift the CCD camera 47 or the workpiece 24, since with this punching device 10 the CCD camera 47 is provided fixed to a portion which is removed from the raising and lowering track of the raising and lowering mechanism 26. Therefore, positional determination for the workpiece 24 at high accuracy is possible, as a result, the accuracy of the punching process can be enhanced.

It should be noted that, in this sequence of operations, the actions of fitting the workpiece 24 and actuating the valves 55 are performed by executing a standard program provided in advance. Furthermore, the lowering of the punch plate 27 and so on is performed by commands being outputted from the CPU 54 to the punch control section 53, when the pattern 24a on the workpiece 24 and the die hole 21b have been mutually aligned, and the punch control section 53 drives the motor 36 based upon these commands.

Figure 10:
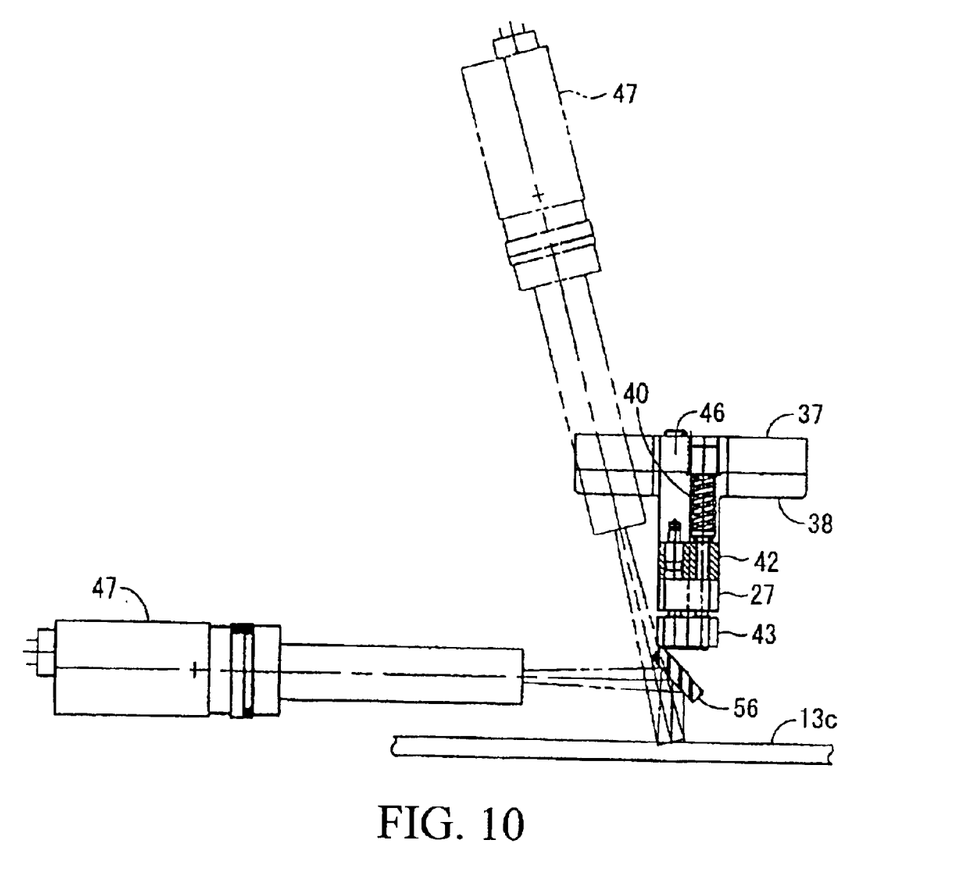
FIG. 10 is a side view showing essential portions of another preferred embodiment of the present invention.

Furthermore, as another preferred embodiment of the present invention, as shown in FIG. 10, it is possible to dispose a mirror 56 below the stripper 43 in the optical path between the CCD camera 47 shown by two-dot chain lines and the die 21. In this case, the CCD camera 47 is not disposed above the θ-axis shift section at an angle, but, as shown by the CCD camera 47 drawn in solid lines in the figure, can be disposed in any of various positions in parallel with the θ-axis shift section 13c. Furthermore, in this case, when performing the punching process, the mirror 56 is shifted to a position away from the raising and lowering track of the punch plate 27.

In this case as well, positional determination at high accuracy can be performed, since it is only the mirror 56 which is shifted, which has no particular influence upon the accuracy of the positional determination. Furthermore, it would be possible to dispose the mirror 56 from the beginning in a position removed from the raising and lowering track. When this is done, the structure of the device is further simplified, since no mechanism for shifting the mirror 56 is required. The other beneficial operational results of this preferred embodiment are the same as those of the first preferred embodiment described above.

It should be understood that, although in the disclosed preferred embodiments the main stand 11 was fixed and the table 13 was shifted, as an alternative construction, it would also be possible for the main stand 11 to be shifted, while the table 13 was fixed. In such a case, the structure would include a fixing stand to which the table 13 was fixed, and the main stand 11 would be shifted with respect to this fixing stand. Thus, in the punching device 10 according to the present invention, either of the above described structures may be employed, provided that the relative positions of the main stand 11 and the table 13 can be varied.

It should be understood that, although the present invention has been shown and described in terms of certain preferred embodiments thereof, and with reference to the drawings, various modifications of the details of any preferred embodiment of the present invention could be made without departing from its scope, which is accordingly to be defined solely by the appended Claims.

What is claimed is:

1. A punching device, comprising:
   a main stand, to which is fixed a die which is provided with a die hole in its upper surface;
   a table, which is provided so as to be shiftable with respect to said main stand, which is formed with a hole approximately in its central portion for exposing said die, and which further is made so that a workpiece is mountable upon its upper surface;
   a shift mechanism which shifts said table with respect to said main stand;
   a raising and lowering mechanism which is arranged above said table and raises and lowers a punch plate to which is fitted a punch which is engageable into said die hole;
   a first photographic device, which is fixed in a position removed from a raising and lowering track of said punch plate, and which photographs a first image which shows a position of said die hole in said die, and a second image which shows a position of a pattern which indicates the position upon said workpiece which is to be punched; and
   a shifting control means which controls said shift mechanism according to said first and second images which are photographed by said first photographic device, so as, by shifting said table, to align a position of said pattern which indicates the position upon said workpiece which is to be punched to the position of said die hole in said die.

2. The punching device of claim 1, wherein said shift mechanism shifts said table with respect to said main stand in two mutually perpendicular directions in a horizontal plane.

3. The punching device of claim 2, wherein said shift mechanism further rotates said table with respect to said main stand within said horizontal plane around a vertical axis.

4. The punching device of claim 1, wherein a mirror is interposed in an optical path between said first photographic device and said table, and said first photographic device photographs said first image which shows the position of said die hole in said die, and said second image which shows the position of said pattern which shows the position upon said workpiece which is to be punched, via said mirror.

5. The punching device of claim 4, wherein said shift mechanism shifts said table with respect to said main stand in two mutually perpendicular directions in a horizontal plane.

6. The punching device of claim 5, wherein said shift mechanism further rotates said table with respect to said main stand within said horizontal plane around a vertical axis.

7. The punching device of claim 1, further comprising:

a second photographic device which is fixed in a position removed from the raising and lowering track of said punch plate, and which photographs an image which shows a position of said die hole in said die, and the position of said pattern which shows the position upon said workpiece which is to be punched; and a monitor device which displays said image which is photographed by said second photographic device.

8. The punching device of claim 7, wherein said shift mechanism shifts said table with respect to said main stand in two mutually perpendicular directions in a horizontal plane.

9. The punching device of claim 8, wherein said shift mechanism further rotates said table with respect to said main stand within said horizontal plane around a vertical axis.

10. The punching device of claim 7, wherein a mirror is interposed in the optical path between said first photographic device and said table, and said first photographic device photographs said first image which shows the position of said die hole in said die, and said second image which shows the position of said pattern which shows the position upon said workpiece which is to be punched, via said mirror.

11. The punching device of claim 10, wherein said shift mechanism shifts said table with respect to said main stand in two mutually perpendicular directions in a horizontal plane.

12. The punching device of claim 11, wherein said shift mechanism further rotates said table with respect to said main stand within said horizontal plane around a vertical axis.

13. A workpiece processing method in which a workpiece is subjected to a punching process using a punching device which comprises: a main stand to which is fixed a die which is provided with a die hole in its upper surface; a table which is provided so as to be shiftable with respect to said main stand, which is formed with a hole approximately in its central portion for exposing said die, and which further is made so that a workpiece is mountable upon its upper surface; and a raising and lowering mechanism which is arranged above said table and raises and lowers a punch plate to which is fitted a punch which is engageable into said die hole; comprising:

an insertion and fixing step of inserting said workpiece between said table and said punch plate and fixing it to said table, with said die being fixed to said main stand and being exposed through said hole in said table;

a step of photographing a first image which shows a position of said die hole in said die with a first photographic device which is fixed in a position removed from the raising and lowering track of said punch plate;

a step of, after fixing said workpiece, photographing with said first photographic device a second image which shows a position of a pattern which indicates a position upon said workpiece which is to be punched;

an alignment step of shifting said table according to said first and second images so as to align the position of said pattern which indicates the position upon said workpiece which is to be punched to the position of said die hole in said die; and a punching step of, after said alignment step, lowering said punch plate which is fitted to said punch and punching said workpiece.

14. The workpiece processing method according to claim 13, wherein said insertion and fixing step comprises:

an insertion step of, while photographing an image which shows the position of said die hole in said die and the position of said pattern which shows the position upon said workpiece which is to be punched with a second photographic device which is fixed in a position removed from the raising and lowering track of said punch plate, inserting said workpiece and positioning it upon said table according to said photographic image; and a fixing step of, after inserting said workpiece, fixing said inserted workpiece to said table.

* * * * *